United States Patent [19]

Gittinger

[11] Patent Number: 5,023,490

[45] Date of Patent: Jun. 11, 1991

[54] ANALOG SIGNAL COMPRESSION CIRCUIT

[75] Inventor: Norman C. Gittinger, Schenectady, N.Y.

[73] Assignee: General Electric Company, Schenectady, N.Y.

[21] Appl. No.: 369,404

[22] Filed: Jun. 21, 1989

[51] Int. Cl.$^5$ .......................... G06F 7/556; H03F 1/30
[52] U.S. Cl. ..................................... 307/492; 307/493; 307/494; 333/14; 341/140; 328/143; 328/144; 328/145
[58] Field of Search ............... 328/142, 144, 145, 143; 307/492, 493, 494; 358/166; 333/14; 341/140

[56] References Cited

U.S. PATENT DOCUMENTS

| | | | |
|---|---|---|---|
| 3,769,611 | 10/1973 | Scaggs | 333/14 |
| 4,136,314 | 1/1979 | Blackmer et al. | 328/145 |
| 4,507,615 | 3/1985 | Bateman | 328/144 |
| 4,712,132 | 12/1987 | Soca | 358/166 |

Primary Examiner—Stanley D. Miller
Assistant Examiner—Richard Roseen
Attorney, Agent, or Firm—Marvin Snyder; James C. Davis, Jr.

[57] ABSTRACT

A desired non-linear, monotonic compression function is performed substantially symmetrically upon both polarities of an AC signal by a circuit having a plurality of limiting stages, each having input circuitry with like terminals connected in parallel to one another, and providing an output current proportional to the stage input voltage, with a gain constant decreasing for an increasing stage number. Each stage has output circuitry connected in parallel with one another and providing an output current proportional to the stage input voltage, with a gain constant decreasing for an increasing stage number. A single output stage converts the total current provided by the limiter stages to an output voltage.

8 Claims, 3 Drawing Sheets

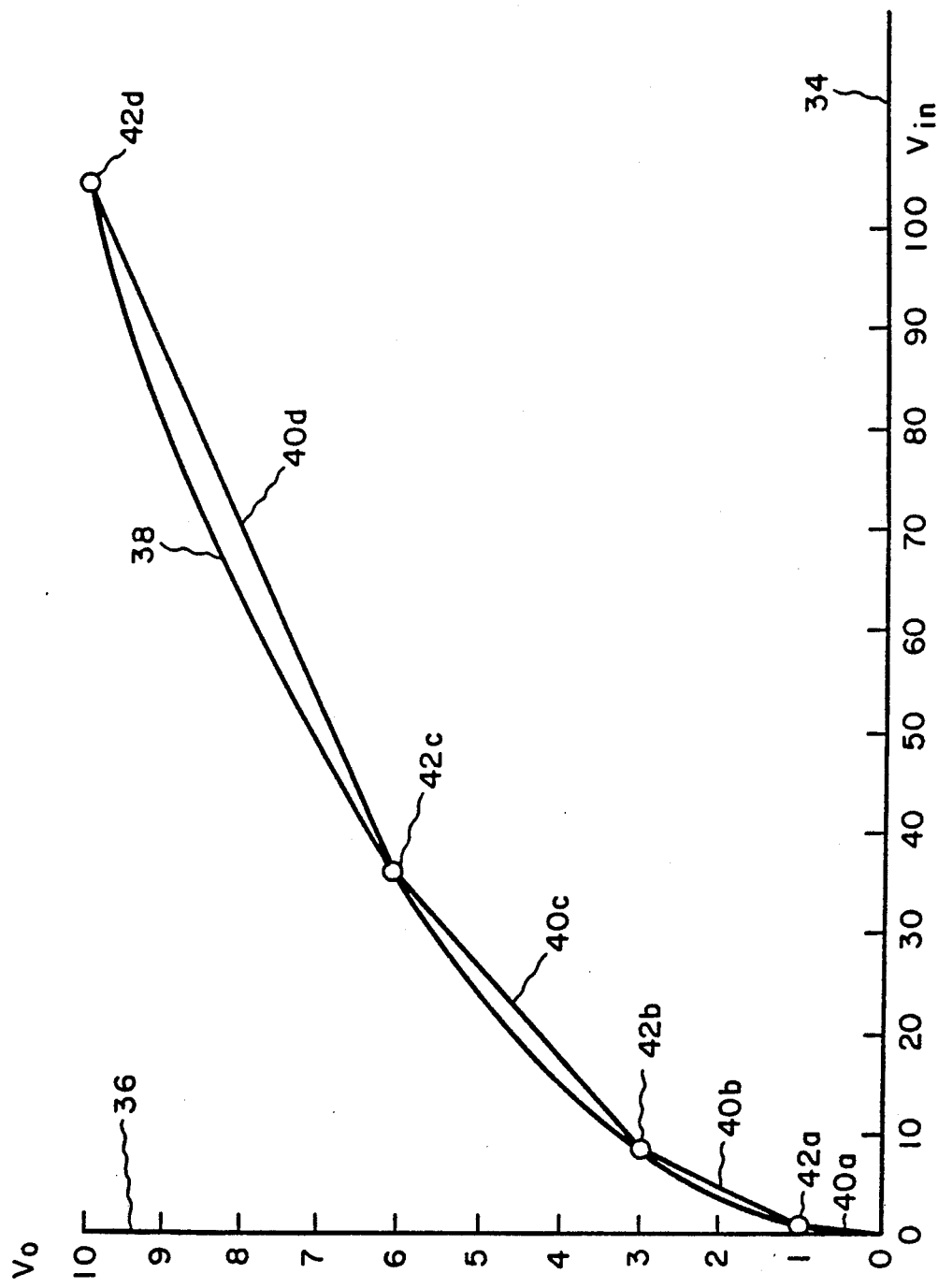

ANALOG SIGNAL COMPRESSION CIRCUIT

BACKGROUND OF THE INVENTION

The present invention relates to circuitry for compressing the amplitude of analog signals, and, more particularly, to a novel circuit which will perform any desired nonlinear and monotonic compression function symmetrically on both polarities of an input AC signal.

Many analog-to-digital conversion systems require that a system dynamic range be provided which is larger than the dynamic range which can be provided by the analog-to-digital converter (ADC) available for use in that system. For example, it may be desirable to provide a high-frequency analog-to-digital conversion system which has 11 bit resolution, but which, for speed considerations and the like, must use an 8-bit flash converter. The three bit difference between the ADC resolution and the desired system resolution can be achieved by causing the input alternating-current signal to undergo a symmetrical nonlinear compression function prior to analog-to-digital conversion, and then following the ADC with a digital decompression circuit, utilizing a look-up table and the like means, as well known to the art. It is highly desirable to provide a symmetrical non-linear, but monotonic, compression function circuit, especially a circuit capable of integration in a hybrid or monolithic integrated circuit, while increasing the low level resolution and dynamic range of the following ADC means.

BRIEF SUMMARY OF THE PRESENT INVENTION

In accordance with the invention, an analog compression circuit for performing a desired non-linear, monotonic compression function substantially symmetrically upon both polarities of an alternating-current (AC) signal, includes: a plurality of limiting stages, each having input circuitry with like terminals connected in parallel to one another, and each having output circuitry connected in parallel with one another and providing an output current proportional to the stage input voltage, with a gain constant decreasing for an increasing stage number; and a single output stage for converting the total current provided by the limiter stages to an output voltage.

In a presently preferred embodiment, the limiter is provided with a square-root gain function $$V_{out} \sqrt{V_{in}} .$$

Accordingly, it is an object of the present invention to provide a novel circuit for the symmetrical nonlinear compression of a AC signal, in accordance with a desired monotonic compression function.

This and other objects of the present invention will become apparent upon reading of the following detailed description for the presently preferred embodiment, when considered in conjunction with the drawings thereof.

BRIEF DESCRIPTION OF THE DRAWINGS

FIG. 2 is an input vs. output voltage transfer function graph for a square-root compression function implemented with one presently preferred embodiment of the present invention.

DETAILED DESCRIPTION OF THE INVENTION

Figure 1:
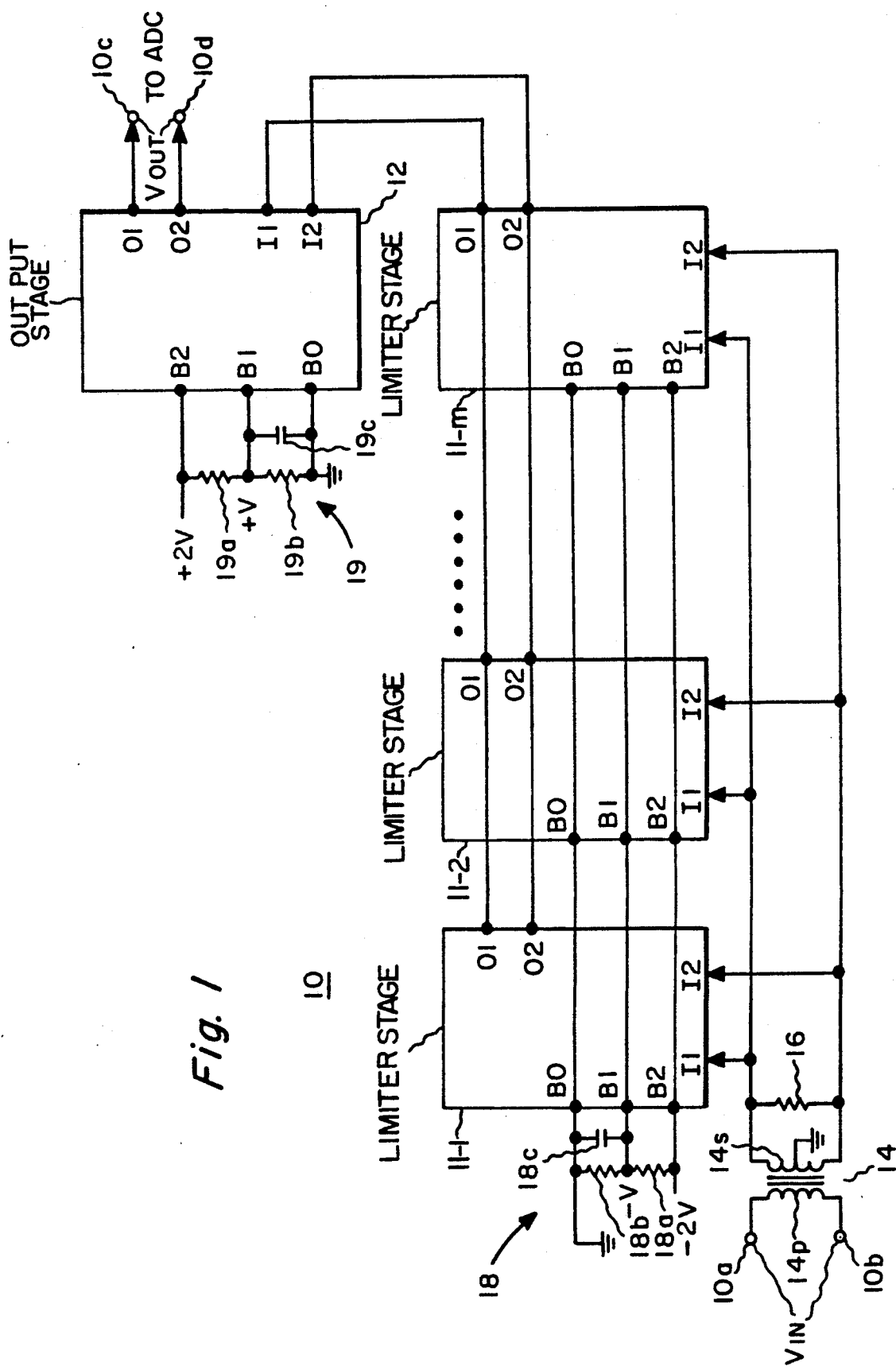
FIG. 1 is a block diagram of an analog compression circuit in accordance with the principles of the present invention.
Figure 1B:
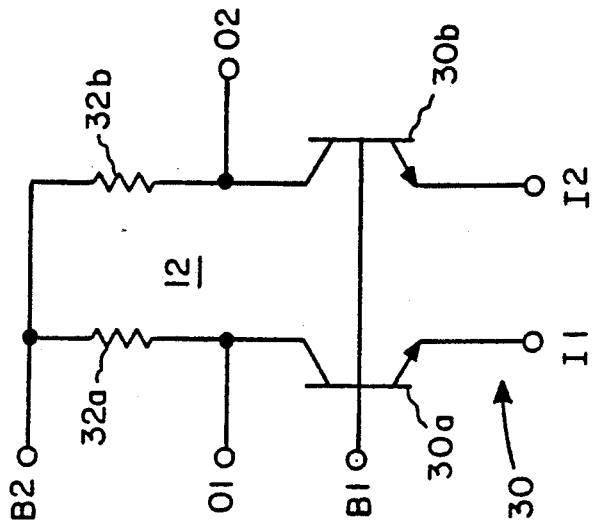
FIGS. 1A and 1B are schematic diagrams, respectively, of respective limiter and output stages of the compression circuit.
Figure 1A:
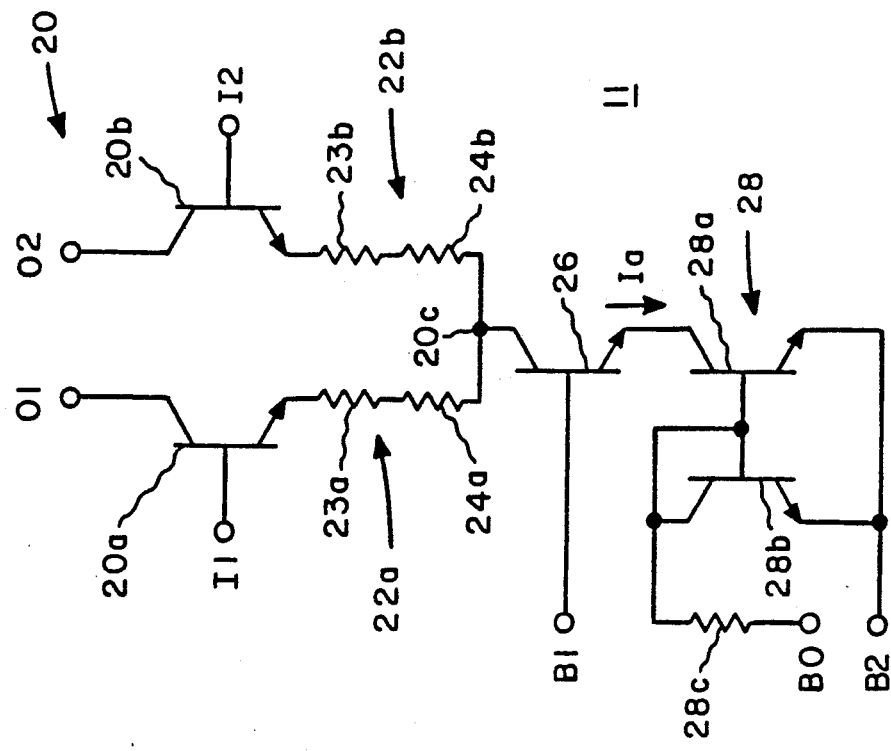

Referring initially to FIG. 1, one presently preferred embodiment of my novel analog compression circuit 10 operates upon a AC input voltage $V_{in}$, appearing between first and second input terminals 10a and 10b, to provide an output signal $V_{out}$, appearing between first and second output terminals 10c and 10d, with a monotonic nonlinear compression function. The analog compression circuit comprises a plurality N of limiter stages 11-i, where $1 \leq i \leq n$, and an output stage 12. The input AC signal is connected to any circuit 14 which provide a balanced signal to stages 11; here, the circuit is passive; the total input signal appears at input transformer 14 primary winding 14p. A center-tapped secondary winding 14s provides a transformed input voltage across a secondary load impedance 16. Means 14 could equally as well be an active circuit. In either case, the voltage at one end of load impedance 16 is applied in parallel to all first inputs I1 of the plurality N of limiter stages, while the signal at the other end of load impedance 16 is applied in parallel to the remaining input I2 of all N limiter stages. An operating-potential-providing circuit 18 is utilized with the limiter stages; in the particular embodiment illustrated, circuit 18 provides: ground potential at a first bias terminal B0 of each stage; a first negative (e.g. $-V$) operating potential at another bias potential terminal B1 of each stage; and a second negative operating potential (here, of approximately twice the first operating potential) at a third terminal B2 of each stage. In this particular case, means 18 comprises first and second substantially equal potential-dividing resistances 18a and 18b, and a bypass capacitance 18c. A somewhat similar potential-providing means 19 (which may illustratively use substantially equal first and second resistances 19a and 19b and a bypass capacitance 19c) is utilized to provide a first positive (e.g. $+V$) voltage at a first terminal B1 and a second operating potential (e.g. $+2$ V) at a second potential terminal B2, both with respect to a ground potential terminal B0, for the output stage 12. Each limiter stage converts the differential input voltage, between terminals I1 and I2, to a differential current flow through terminals O1 and O2. A first output O1 of each limiter stage 11 is connected in parallel with all other first outputs of all other limiter stages, and to a first input I1 of the output stage 12. Similarly, each second output O2 of each of the plurality N of limiter stages is connected in parallel to one another and to a second input I2 of the output stage. The compression circuit output terminals 10c and 10d are respectively connected to an associated one of output stage first and second output terminals O1 and O2, respectively.

Each limiting stage 11 is a wide-band cascode amplifier with a controlled limiting feature, to generate an approximation to the desired monotonic non-linear input/output function by means of a stage breakpoint set by a first ratio of resistance and by a stage gain set by a second resistance ratio. The compression circuit 10 has, as will be more clearly seen with respect to FIG. 2, a plurality N of such breakpoints, with one breakpoint and one gain being established by each limiter stage 11.

Each limiter stage 11 contains a differential-input amplifier 20, comprised of first and second transistors 20a and 20b. The gain of the differential amplifier is established by the essentially equal total resistance 22a or 22b connected to a node 20c from the emitter electrode of the respective associated amplifier transistor 20a or 20b. Each emitter resistance 22a or 22b can be provided by a plurality of series-connected resistances, such as first resistor 23a or 23b and second resistor 24a or 24b. The base electrode of first or second device 20a or 20b forms the first or second limiter stage input I1 or I2. Similarly, the collector electrode of device 20a or 20b forms the output O1 or O2 of the stage. A third device 26 has its collector electrode connected to node 20c, its base electrode connected to bias terminal B1 and its emitter electrode connected to the collector electrode of a first current-mirror device 28a. Device 28a has an emitter electrode connected to bias terminal B2 and a base electrode connected to a base electrode of device 28b. A second current-mirror device 28b also has its emitter electrode connected to bias terminal B2, and has its base and collector electrodes connected together and, via a current-setting resistance 28c, to bias terminal B0. Thus, devices 28a and 28b, in conjunction with resistance 28c, form a current-mirror means 28, which establishes the total emitter current $I_a$ flowing in differential-amplifier devices 20a and 20b of the same stage.

The output stage 12 comprises a pair of devices 30a and 30b, having their base electrodes connected in common to first bias terminal B1, and having their individual emitter electrodes respectively connected to first and second input terminals I1 and I2. A cascode circuit will be seen to be formed between each limiter stage device 20a or 20b and its associated output stage device 30a or 30b. The low input impedance of output stage devices 30a and 30b minimize signal voltage variation at the collector electrodes of the limiting amplifier devices 20a and 20b, thereby minimizing the effect of shunt and "Miller" capacitances which would otherwise limit bandwidth. The output of each of transistors 30a or 30b appears across an associated output resistor 32a or 32b, connected between the output stage second bias terminal B2 and the respective output terminal O1 or O2. The voltage appearing between output circuit 12 terminals O1 and O2 can be applied to a wide-bandwidth, single-ended output driver (not shown) and the like, to provide the input signal for a following single-ended ADC.

Referring now to all of the Figures, the particular compression gain function selected is provided by the choice of total emitter resistance 22a/22b in each leg of each limiter stage, as well as the total limiter stage current $I_a$ established by the magnitude of resistance 28c in that particular stage. For purposes of illustration, the non-linear compression gain function will be a square-root function $$V_{out} \sqrt{V_{in}}$$

Input voltage $V_{in}$ is plotted along abscissa 34 of FIG. 2, while output voltage $V_{out}$ is plotted along ordinate 36. The ideal transfer function curve 38 is piecewise-linearly approximated by an actual transfer function curve 40, having a plurality N of segments 40i and a like plurality of breakpoints 42i. In the illustrated compression circuit, N=4 and there are four limiter stages 11-1 through 11-4, with the transfer function having four segments 40a–40d and four breakpoints 42a–42d.

If the differential-input pair matched emitter resistors 22a and 22b are of a relatively low resistance value, then a relatively large AC signal current change occurs in the collector circuit for a small change in AC input signal voltage This collector circuit current change appears as a large signal voltage change across output stage load resistors 32a and 32b, resulting in a high input-to-output voltage gain for circuit 10. Thus, the bias current established by the current mirror means 28, of each limiter stage, is relatively low, resulting from a relatively high value of resistor 28c. Device 26 provides isolation between the current mirror means 28 and the differential pair 20. The combination of (1) high current gain in pair 20, and (2) low current supplied to that pair, results in current limiting as soon as the input peak signal voltage becomes high enough to cause all the available current $I_a$ to flow through only one of devices 20a or 20b. This input peak signal voltage is relatively low. It will be seen that, during an opposite half-cycle of the input voltage swing, the other one of the differential pair transistors 20a or 20b limits, so that a substantially symmetrical limiting action occurs. The tighter the control of parameter matching between devices 20a and 20b, the tighter will be the symmetrical limiting action engendered thereby. Ideally, the devices 20a and 20b should be a matched pair of devices, residing in the same die, at the same temperature and the like. Further, it will be seen that above the limiting threshold, the pair of devices 20 make no further contribution to the total current gain for each limiting stage, resulting in a "knee", or breakpoint, 42i in the total gain curve. A higher voltage breakpoint will be provided concurrent with a lower current gain (and therefore a lower total gain and slope of segment 40i) by setting the total emitter resistance 22a/22b of each differential pair to a greater value, and by providing a greater total current $I_a$, for each successively higher-limiter stage 11-i. Thus, total emitter resistance 22a/22b of the higher-gain first limiter stage 11-1 is less than the total emitter resistance of the lesser-gain second limiter stage 11-2, which is in turn less than the emitter resistance of the even-lesser-gain third limiter stage 11-3 and the least-gain fourth (here, last) limiter stage 11-4 emitter resistance is even greater. Similarly, the current-setting resistance 28c of the first stage is greater than that of the second stage, which is greater than that of the third stage, and so on, with the last stage resistance 28c being least, so that the total stage current Ia is least in the first stage 11-1, and progressively grows greater until the last stage 11-n is reached. Due to the greater available current $I_a$ in each successive stage, that stage limits at a higher peak input signal voltage, so that the successively greater breakpoint values (here, voltages) 42b, 42c, 42d, ... are generated at successively greater-numbered limiter stages 11-2, 11-3, 11-4, .... It will be seen that breakpoints 42i are spaced in such a manner as to provide a close approximation to the desired nonlinear monotonic curve. It will also be seen that the final breakpoint (here breakpoint 42d) results when the final stage 11-n enters the limiting condition. It will also be seen that input voltage $V_{in}$ should be externally limited to a peak-to-peak value less than the minimum base-emitter reverse breakdown voltage of the devices 20a/20b in the first limiting stage. If necessary, series diodes or other appropriate means can be introduced into either the base or emitter leads of the differential-pair devices 20 to reduce this input voltage limit.

Illustrating the design for a given response curve (the illustrated $$V_{out} \sqrt{V_{in}}$$

a total of N=4 limiter stages as selected; each stage contains a pair of transistors 20 from a type CA3127E amplifier integrated circuit, available from RCA and the like, for each of transistor pairs 20a/20b, 28a/28b and 30a/30b, and with a type 2N3904 transistor used for device 26. A sample design procedure is as follows:

In the first step, the highest output level gain, which is the gain for that segment (e.g. segment 40d) resulting in the highest output voltage, is first determined from the desired non-linear response function plot after the appropriate breakpoints 42i are selected. For the illustrated square-root approximation, breakpoints are selected at input voltages of 1, 9, 36 and 100 units (where the plot is of arbitrary units, for convenience). Here, the high-level-signal gain is $\Delta V_{out}/\Delta V_{in} = (10\text{-}6)/(100\text{-}36) = 0.0625$. The devices 20a/20b of the last limiting stage, e.g. stage 11-4, are assumed to be emitter followers operating with unity gain, so the required gain is set by the ratio of the equal load resistors 32a/32b to the equal emitter resistors 22a/22b for the fourth limiting stage 11-4. Setting load resistors 32a/32b to each be a normalized 1 ohm, the total emitter resistance $R_{e,4}$ for each of resistors 22a/22b in the fourth stage 11-4, is thus set at 16 ohms. The next highest-level gain slope for segment 40c is now determined to be (6-3)/(36-9) or 0.1111. Two stages (stages 11-3 and 11-4) are now providing this gain, the ratio of load resistors 32a/32b to third-stage 11-3 emitter resistors 22a/22b must be selected with the contribution of fourth stage gain being taken into account. By considering the third stage emitter resistors to be in parallel with the fourth stage emitter resistors, the parallel ratio of 1/9 indicates that a total of 9 ohms net is to be realized, so that each of the total emitter resistance in the third limiting stage calculates out to be about 20.57 ohms. Similarly, the next highest-level gain slope 40b can be calculated as 0.25, resulting in a total parallel resistance of 4 ohms, so that each resistance 22a/22b of the second limiting stage 11-2 can be calculated to be about 7.2 ohms each. Finally, the bottom segment 40a has a low level gain slope of one, and requires that a parallel resistance of 1 be realized; each emitter resistance in the first limiting stage 11-1 can be calculated to be 1.3333 ohms each.

In the second step, the available current $I_a$ of each of the N stages is selected. This current determines each stage breakpoint, by setting the point at which each stage limits. Therefore, the devices 20a/20b in the first stage 11-1 must limit when the applied input voltage reaches 1 volt peak, or 2 volts peak-to-peak. Positive limiting occurs when one of the devices takes all of the available current and the other device is in the cut-off condition; this can happen only if the available current $I_a$ is $V_{pp}/R22$, where R22 is either emitter resistance R22a or R22b of that stage. For the first stage 11-1, $V_{pp}=2$ volts and R22=1.3333 ohms, so that the available current $I_{a,1}=1.5$ amperes. This current is set by resistor 28c of the first stage, in conjunction with the negative supply amplitude ($-2V$) at terminal B2. Similarly, the devices 20a/20b in second limiting stage 11-2 must limit at 9 volts peak, so that the current $I_{a,2}$ is 18 volts/7.2 ohms=2.5 amperes, set by the second stage resistor 28c. Similarly, in stage 11-3, at 36 volts peak, the current $I_{a,3}=72$ volts/20.75 ohms=3.5 amperes. In the last stage 11-4, the current is 200 volts/16 ohms=12.5 amperes=$I_{a,4}$. It will be seen that the total current, before scaling, is 20 amperes.

In the third step, scaling is applied to set total gain and obtain reasonable voltage, current and/or resistance values. The maximum allowable input voltage $V_{in}$ is set by the base-emitter breakdown voltage of transistors 20a/20b in the first stage 11-1. The maximum peak-to-peak input voltage appears across these transistor junctions. Using a reasonable peak-to-peak AC input voltage of 5 volts (or 1.77 volts RMS) and with plus and minus 15 volt power supplies (V=7.5 volts), the maximum output voltage swing is about 5 volts peak-to-peak across resistors 32a/32b. For a total current of about 5 milliamperes, output resistors 32a/32b are each about 1000 ohms. Since the maximum output voltage is now 5 volts, instead of 10 volts, and the maximum input voltage is now 5 volts instead of 100 volts, all gains must be scaled. The maximum linear gain input voltage is 5(1/100)=0.05 volts, while the maximum linear gain output voltage is 5(1/10)=0.5 volts, for a linear gain of 10. Since gain is equal to the ratio of the output resistors 32 (already set to 1000 ohms), divided by the effective net parallel resistance of the four stages, the effective parallel resistance must be 100 ohms. Since the ratio of emitter resistances in the four stages has already been established, these ratios are retained to set the actual resistances so that $R_{22}$ in the first stage 11-1 is 133.33 ohms, in the second stage 11-2 is 720 ohms, in the third stage 11-3 is 2050 ohms and in the fourth stage 11-4 is 1600 ohms. Finally, scaling the currents by a factor of 5 ma/20A, the following currents and values of setting resistance 28c, for each stage (assuming a $-15$ volt power supply) are found: $I_{a,1}=0.375$ ma, with $R_{28C,1}=40K$; $I_{a,2}=0.625$ ma. With $R_{28C,2}=24K$; $I_{a,3}=0.875$ ma. with $R_{28C,3}=17.143K$; and $I_{a,4}=3.25$ ma. with $R_{28C,4}=4.8K$. Setting the base biasing of devices 26 at $-7.5$ volts, and base biasing of devices 30 at $+7.5$ volts, completes the design.

In an experimental circuit built to confirm the design calculated as above, it was shown that the transistor internal emitter resistances 23a/23b must be included in the total emitter resistor 22a/22b values, resulting in smaller values of the physical resistors 24a/24b actually utilized external to the transistor 20. It was found that the effective emitter resistance of the device 20a/20b utilized in the first limiting stage 11-1 were actually more than the required 133.33 ohms, so that a further scaling of the design was undertaken. The resulting circuit values were R18A=R18B=R19A=R19B=15K and R32A=R32B=100 ohms; R24A/24B were 0 ohms in stage 11-1 (where an internal resistance of 172 ohms was calculated), and were 799 ohms in stage 11-2 (where an internal resistance of 130 ohms was calculated). The external emitter resistors were 2.56K in stage 11-3 (where an internal resistance of 81 ohms was calculated), and were 2K in stage 11-4 (where an internal resistance of 69 ohms was calculated). The stage current-setting resistances 28c were 42.5K in first stage 11-1, 25.5K in second stage 11-2, 18K in third stage 11-3 and 5.1K in fourth stage 11-4. Excellent agreement between theoretical and actual data (after scaling) was found.

While one presently preferred version of my novel analog compression circuit has been illustrated herein, many variations and modifications will now become apparent to those skilled in the art. It is my intent, therefore, to be limited only by the scope of the appending claims, and not by the specific details and instrumentalities presented by way of illustration of one possible circuit embodiment herein.

What is claimed is:

1. An analog compression circuit for performing a desired non-linear, monotonic compression function substantially symmetrically upon both polarities of an alternating-current (AC) input signal, including: input means for receiving said input signal; a plurality N of limiting stages, each having input circuitry with like terminals connected in parallel to one another to receive an input voltage from said input means, and having output circuitry providing an output current proportional to said input voltage, with a gain constant decreasing for an increasing stage number, said output circuitry having like terminals connected in parallel so as to provide a total of the output currents from said limiting stages; and a single output stage for receiving said total of the output currents from said limiting stages and converting said total to an output voltage.

2. The circuit of claim 1 wherein said input means comprises: an input transformer having a primary winding receiving said input signal, and a secondary winding providing the input voltage to the input circuitry of all of said limiting stages; and a load resistance coupled across the transformer secondary winding.

3. The circuit of claim 2, wherein said secondary winding is substantially center-tapped.

4. The circuit of claim 1, wherein each of the N limiting stages comprises: a differential amplifier; a current-mirror means for establishing a total current $I_a$ flowing through the differential amplifier; and means for electrically isolating the current-mirror means from said differential amplifier.

5. The circuit of claim 4, wherein the differential amplifier has a pair of inputs, each coupled to the like terminals of said input circuitry of each of the other (N−1) limiting stages, and has a pair of outputs, each coupled to the like output terminals of said output circuitry of each of the other (N−1) limiting stages.

6. The circuit of claim 5, wherein the differential amplifier comprises: a pair of transistors, each having a base electrode connected to an associated one of the differential amplifier inputs, a collector electrode connected to an associated one of the differential amplifier outputs, and an emitter electrode; and a pair of substantially-equal emitter resistances, each connected from an associated emitter electrode to a common node, through which said total current $I_a$ flows.

7. The circuit of claim 1, wherein the single output stage comprises: a pair of transistors, each connected in series with a respective load resistor and a potential source and having an input receiving the total current from like outputs of all of the N limiting stages.

8. The circuit of claim 1, wherein the nonlinear function is the output voltage varying as the square-root of the input voltage.

* * * * *